(12) United States Patent
Gaska et al.

(10) Patent No.: US 9,543,400 B2
(45) Date of Patent: Jan. 10, 2017

(54) OHMIC CONTACT TO SEMICONDUCTOR

(71) Applicant: Sensor Electronic Technology, Inc., Columbia, SC (US)

(72) Inventors: Remigijus Gaska, Columbia, SC (US); Michael Shur, Latham, NY (US); Jinwei Yang, Columbia, SC (US); Alexander Dobrinsky, Loudonville, NY (US); Maxim S. Shatalov, Columbia, SC (US)

(73) Assignee: Sensor Electronics Technology, Inc., Columbia, SC (US)

( * ) Notice: Subject to any disclaimer, the term of this patent is extended or adjusted under 35 U.S.C. 154(b) by 0 days.

(21) Appl. No.: 14/973,563

(22) Filed: Dec. 17, 2015

(65) Prior Publication Data

US 2016/0104784 A1    Apr. 14, 2016

Related U.S. Application Data

(62) Division of application No. 13/775,038, filed on Feb. 22, 2013, now Pat. No. 9,269,788.

(Continued)

(51) Int. Cl.
*H01L 31/072* (2012.01)
*H01L 29/45* (2006.01)
(Continued)

(52) U.S. Cl.
CPC ....... *H01L 29/452* (2013.01); *H01L 21/28575* (2013.01); *H01L 29/155* (2013.01); *H01L 29/2003* (2013.01); *H01L 29/205* (2013.01); *H01L 29/401* (2013.01); *H01L 29/66431* (2013.01); *H01L 29/66462* (2013.01); *H01L 29/737* (2013.01); *H01L 29/778* (2013.01);
(Continued)

(58) Field of Classification Search
CPC .............................. H01L 33/06; H01L 33/0045
USPC ........................................... 257/103, 79, 190
See application file for complete search history.

(56) References Cited

U.S. PATENT DOCUMENTS 5,747,878 A    5/1998  Murakami et al.
5,804,877 A    9/1998  Fuller et al.
(Continued)

FOREIGN PATENT DOCUMENTS

JP    2006517726 A    7/2006
KR    20110067512 A    6/2011

OTHER PUBLICATIONS

Gebremariam, S., U.S. Appl. No. 13/775,038, Notice of Allowance, Oct. 14, 2015, 18 pages.

(Continued)

*Primary Examiner* — Samuel Gebremariam
(74) *Attorney, Agent, or Firm* — LaBatt, LLC

(57) ABSTRACT

A solution for forming an ohmic contact to a semiconductor layer is provided. A masking material is applied to a set of contact regions on the surface of the semiconductor layer. Subsequently, one or more layers of a device heterostructure are formed on the non-masked region(s) of the semiconductor layer. The ohmic contact can be formed after the one or more layers of the device heterostructure are formed. The ohmic contact formation can be performed at a processing temperature lower than a temperature range within which a quality of a material forming any semiconductor layer in the device heterostructure is damaged.

20 Claims, 7 Drawing Sheets

Related U.S. Application Data

(60) Provisional application No. 61/602,155, filed on Feb. 23, 2012.

(51) Int. Cl.

| | | |
|---|---|---|
| *H01L 29/66* | (2006.01) |
| *H01L 29/778* | (2006.01) |
| *H01L 21/285* | (2006.01) |
| *H01L 29/40* | (2006.01) |
| *H01L 33/00* | (2010.01) |
| *H01L 29/15* | (2006.01) |
| *H01L 29/20* | (2006.01) |
| *H01L 29/205* | (2006.01) |
| *H01L 33/14* | (2010.01) |
| *H01L 29/737* | (2006.01) |
| *H01L 33/06* | (2010.01) |
| *H01L 33/32* | (2010.01) |
| *H01L 29/201* | (2006.01) |
| *H01L 33/40* | (2010.01) |

(52) U.S. Cl.
CPC ......... *H01L 29/7786* (2013.01); *H01L 33/007* (2013.01); *H01L 33/0075* (2013.01); *H01L 33/06* (2013.01); *H01L 33/14* (2013.01); *H01L 33/32* (2013.01); *H01L 33/405* (2013.01); *H01L 29/201* (2013.01); *H01L 33/40* (2013.01); *H01L 2933/0016* (2013.01)

(56) References Cited

U.S. PATENT DOCUMENTS

| | | | |
|---|---|---|---|
| 5,818,078 | A | 10/1998 | Makiyama et al. |
| 6,313,534 | B1 | 11/2001 | Nakamura et al. |
| 6,455,870 | B1 | 9/2002 | Wang et al. |
| 6,657,300 | B2 | 12/2003 | Goetz et al. |
| 6,858,522 | B1 | 2/2005 | Burton et al. |
| 7,943,924 | B2 | 5/2011 | Bergmann et al. |
| 7,943,949 | B2 | 5/2011 | Li et al. |
| 7,977,223 | B2 | 7/2011 | Byun et al. |
| 2004/0061129 | A1 | 4/2004 | Saxler et al. |
| 2005/0082568 | A1 | 4/2005 | Hirose et al. |
| 2007/0077745 | A1 | 4/2007 | He et al. |
| 2008/0079009 | A1 | 4/2008 | Yaegashi |
| 2008/0128753 | A1 | 6/2008 | Parikh et al. |
| 2008/0176366 | A1 | 7/2008 | Mita et al. |
| 2010/0096646 | A1* | 4/2010 | Jeong .................. H01L 27/153 257/88 |
| 2011/0169138 | A1 | 7/2011 | Lin et al. |
| 2011/0278644 | A1 | 11/2011 | Gao et al. |
| 2012/0025271 | A1 | 2/2012 | Nakano |

OTHER PUBLICATIONS

Gebremariam, S., U.S. Appl. No. 13/775,038, Office Action 1, Jan. 16, 2015, 19 pages.

Nesso, S., Application No. EP 13 75 2529, Supplementary Search Report, Sep. 22, 2015, 6 pages.

Park, International Search Report and Written Opinion for International Application No. PCT/US2013/027496, Jun. 25, 2013, 11 pages.

Dasgupta, S. et al., "Ultralow nonalloyed Ohmic contact resistance to self aligned N-polar GaN high electron mobility transistors by In(Ga)N regrowth," Applied Physics Letters, vol. 96, p. 143504, 2010.

Guo, J. et al., "Metal-face InAlN/AlN/GaN high electron mobility transistors with regrown ohmic contacts by molecular beam epitaxy," physica status solidi (a), vol. 208, pp. 1617-1619, Jul. 2011.

Heikman, S. et al., "Mass transport regrowth of GaN for ohmic contacts to AlGaN/GaN," Applied Physics Letters, vol. 78, pp. 2876-2878, 2001.

Heikman, S. et al., "Selective Area Mass Transport Regrowth of Gallium Nitride," Japanese Journal of Applied Physics, vol. 40, pp. 565-566, Feb. 2001.

Saripalli, Y. et al., "Properties of III-N MOS structures with low-temperature epitaxially regrown ohmic contacts," Journal of Crystal Growth, vol. 287, pp. 562-565, Jan. 2006.

Saripalli, Y. N. et al., "Transmission electron microscopy studies of regrown GaN Ohmic contacts on patterned substrates for metal oxide semiconductor field effect transistor applications," Applied Physics Letters, vol. 90, p. 204106, 2007.

Seo, H.-C. et al., "Interface analysis of Ti/Al/Ti/Au ohmic contacts with regrown n+-GaN layers using molecular beam epitaxy," Surface and Interface Analysis, vol. 43, pp. 1627-1631, Dec. 2011.

Wong, M. H. et al., "Low nonalloyed Ohmic contact resistance to nitride high electron mobility transistors using N-face growth," Applied Physics Letters, vol. 91, p. 232103, 2007.

Xing, H. et al., "Gallium nitride based transistors," Journal of Physics: Condensed Matter, vol. 13, pp. 7139-7157, Aug. 2001.

* cited by examiner

OHMIC CONTACT TO SEMICONDUCTOR

REFERENCE TO RELATED APPLICATIONS

The current application is a divisional of U.S. patent application Ser. No. 13/775,038, which was filed on 22 Feb. 2013, and which claims the benefit of U.S. Provisional Application No. 61/602,155, which was filed on 23 Feb. 2012, both of which are hereby incorporated by reference.

TECHNICAL FIELD

The disclosure relates generally to contacts to semiconductors, and more particularly, to an ohmic contact to a semiconductor, such as a nitride-based semiconductor.

BACKGROUND ART

A challenge in developing high power III-V material-based semiconductor devices, such as light emitting diodes (LEDs), laser diodes (LDs), bipolar junction transistors (BJTs), and heterojunction bipolar transistors (HBTs), is the development of an ohmic contact that has both a low specific resistance and a high current carrying capability. For example, the challenge to manufacture a low resistance ohmic contact to n-type material is particularly important for deep ultraviolet LEDs made from group III-nitride materials, such as Aluminum Gallium Nitride (AlGaN) or Aluminum Gallium Indium Nitride (AlGaInN), which include a high molar fraction of aluminum.

To achieve a low n-type contact resistance in a nitride-based device, several contact metals and a relatively high annealing temperature are generally used. To this extent, Al can be used as a contact metal because of its relatively low melting point of approximately 660 degrees Celsius. Furthermore, Titanium (Ti) or Chromium (Cr) can be used as the first layer of the contact due to their low metal work function to nitrides. Specific examples include Ti/Al/Ti/Gold (Au) or Ti/Al/Nickel (Ni)/Au, with thicknesses from five nanometers to five microns and which are annealed at 400 degrees Celsius or higher temperatures. Another approach reverses the order of the Ti and Al, and forms an Al/Ti-based contact to an n-type GaN semiconductor, which includes Al/Ti/Platinum (Pt)/Au and which is annealed at temperatures between 400 and 600 degrees Celsius. Still other approaches form a Cr/Al-based contact to an n-type GaN semiconductor, which include various metal configurations, such as Cr/Al/Cr/Au, Cr/Al/Pt/Au, Cr/Al/Pd/Au, Cr/Al/Ti/Au, Cr/Al/Cobalt (Co)/Au, and Cr/Al/Ni/Au.

Contact reliability also can be a problem. For example, to date, Ti/Al-based n-type contacts for ultraviolet LEDs emitting 265 nanometer and shorter wavelengths have not been shown to be very reliable.

Some approaches have improved an ohmic contact through re-growing semiconductor layers after performing the etching process. For example, in one approach, a non-alloyed contact is formed through a process of re-growing semiconductor layers. The process includes: (1) growing semiconductor layers on a substrate such as sapphire; (2) disposing a regrowth mask above the top semiconductor layer, where the regrowth mask material (e.g., silicon nitride or silicon dioxide) is chosen, deposited, and selectively removed (e.g., through the use of a photoresist) so that is can function as a passivation layer on the semiconductor surface; (3) etching the semiconductor layers with an acceptable depth being approximately five to one thousand nanometers past the surface of the top semiconductor layer; (4) growing structures in the etched regions; and (5) optionally applying photolithography to define a gate region for devices that include gates.

FIGS. 1A-1C show typical ohmic contacts 2A-2C, respectively, formed using reactive ion etching (RIE) and re-growth processes according to the prior art. In each case, RIE of a semiconductor layer 4A-4C is employed prior to re-growth. Re-growth is carried through with subsequent deposition of an ohmic metal 6A-6C. In FIG. 1A, the ohmic contact 2A includes a regrown surface state compensating layer on the RIE damaged layer 4A. In FIG. 1B, the ohmic contact 2B includes a regrown surface state compensating layer and a delta doping layer. In FIG. 1C, the ohmic contact 2C includes a regrown surface state compensating layer and a layer for low specific ohmic contact resistance. As illustrated in FIGS. 1A-1C, the regrown technique can be used in conjunction with other features, such as delta-doping as shown in FIG. 1B. The delta-doping has significance for high speed devices, such as heterostructure field-effect transistors, which employ the delta-doping technique to achieve a high carrier density, and large breakdown voltage of the gate. In addition, the regrowth technique can be used together with contacts that include a rough morphology as shown in FIG. 1C, as well as contacts that are annealed with regrowth regions and have protrusions into regrowth region. While the quality of each of the contacts 2A-2C is significantly improved by re-growing as compared to direct deposition of the ohmic metal 6A-6C, each process has a large number of defects in the RIE etched region 4A-4C, which reduces the quality of the ohmic contact 2A-2C and decreases an overall lifetime of the corresponding device including the ohmic contact 2A-2C.

Another regrowth approach is specifically designed to regrow group III nitride semiconductor layers. The process includes: (1) growing a semiconductor body on a substrate including semiconductor layers with an unintentionally doped (UID) gallium nitride (GaN) layer overlying the semiconductor layers and a UID aluminum gallium nitride (UID-AlGaN) layer overlying GaN semiconductor layers; (2) depositing and patterning an insulating film; and (3) re-growing an n+ GaN layer at regions of the surface of the UID-AlGaN not covered with insulating film without etching the surface of the UID-AlGaN semiconductor.

SUMMARY OF THE INVENTION

Aspects of the invention provide a solution for forming an ohmic contact to a semiconductor layer. A masking material is applied to a set of contact regions on the surface of the semiconductor layer. Subsequently, one or more layers of a device heterostructure are formed on the non-masked region(s) of the semiconductor layer. The ohmic contact can be formed after the one or more layers of the device heterostructure are formed. The ohmic contact formation can be performed at a processing temperature lower than a temperature range within which a quality of a material forming any semiconductor layer in the device heterostructure is damaged.

A first aspect of the invention provides a method comprising: forming a device heterostructure including an ohmic contact to a semiconductor layer in a set of semiconductor layers of the device heterostructure without etching the semiconductor layer, wherein the forming includes: applying a masking material on a set of contact regions corresponding to the ohmic contact on a surface of the semiconductor layer; forming a protruded region over a set of unmasked regions of the surface of the semiconductor layer after the applying; and forming the ohmic contact on the set of contact regions after formation of the protruded region, wherein the forming the ohmic contact is performed at a processing temperature lower than a temperature range within which a quality of a material forming any one of the set of semiconductor layers in the device heterostructure is damaged.

A second aspect of the invention provides a device comprising: a device heterostructure including an ohmic contact to a semiconductor layer in a set of semiconductor layers of the device heterostructure, wherein the ohmic contact includes a set of highly conductive semiconducting layers formed on a set of contact regions of the semiconductor layer, wherein the set of highly conductive semiconducting layers are lattice matched with the semiconductor layer at an interface of the semiconductor layer and the set of highly conductive semiconducting layers.

A third aspect of the invention provides a system comprising: a fabrication system for forming a device heterostructure including an ohmic contact to a semiconductor layer in a set of semiconductor layers of the device heterostructure without etching the semiconductor layer, wherein the forming includes: applying a masking material on a set of contact regions corresponding to the ohmic contact on a surface of the semiconductor layer; forming a protruded region over a set of unmasked regions of the surface of the semiconductor layer after the applying; and forming the ohmic contact on the set of contact regions after formation of the protruded region, wherein the forming the ohmic contact is performed at a processing temperature lower than a temperature range within which a quality of a material forming any one of the set of semiconductor layers in the device heterostructure is damaged.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a solution for forming an ohmic contact to a semiconductor layer. A masking material is applied to a set of contact regions on the surface of the semiconductor layer. Subsequently, one or more layers of a device heterostructure are formed on the non-masked region(s) of the semiconductor layer. The ohmic contact can be formed after the one or more layers of the device heterostructure are formed. The ohmic contact formation can be performed at a processing temperature lower than a temperature range within which a quality of a material forming any semiconductor layer in the device heterostructure is damaged. The ohmic contact formation can be performed without etching the semiconductor layer and can enable the ohmic contact to be lattice matched with the semiconductor layer at the interface of the ohmic contact with the semiconductor layer. The resulting ohmic contact can have a higher reliability than that of ohmic contacts formed using previous approaches. As used herein, unless otherwise noted, the term "set" means one or more (i.e., at least one) and the phrase "any solution" means any now known or later developed solution.

Figure 2:
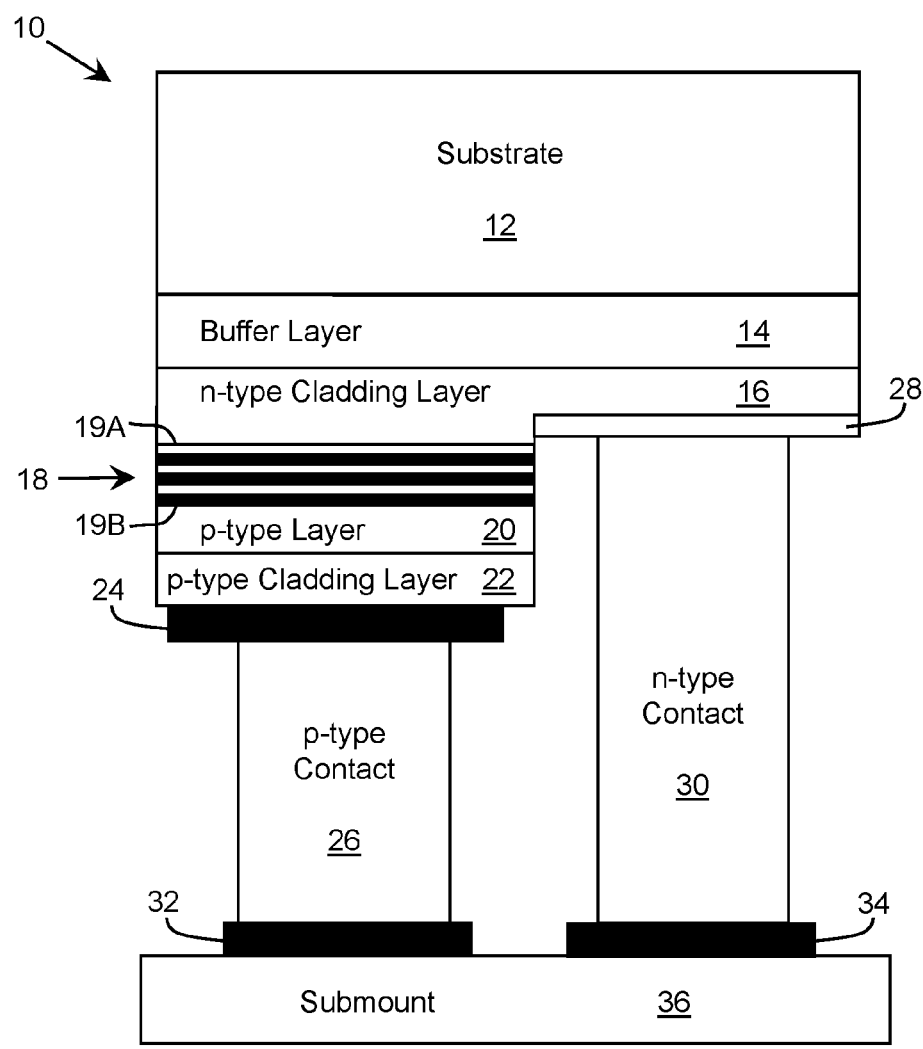
FIG. 2 shows a schematic structure of an illustrative emitting device according to an embodiment.

Turning to the drawings, FIG. 2 shows a schematic structure of an illustrative emitting device 10 according to an embodiment. In a more particular embodiment, the emitting device 10 is configured to operate as a light emitting diode (LED), such as a conventional or super luminescent LED. Alternatively, the emitting device 10 can be configured to operate as a laser diode (LD). In either case, during operation of the emitting device 10, application of a bias comparable to the band gap results in the emission of electromagnetic radiation from an active region 18 of the emitting device 10. The electromagnetic radiation emitted by the emitting device 10 can comprise a peak wavelength within any range of wavelengths, including visible light, ultraviolet radiation, deep ultraviolet radiation, infrared light, and/or the like.

While aspects of the invention are shown and described in conjunction with an emitting device 10, it is understood that aspects of the invention can be utilized in the formation of other types of devices. For example, the device can be a light detecting device, a photodetector, a photodiode, and/or the like. Similarly, the device can be bipolar junction transistor (BJT), a heterojunction bipolar transistor (HBT), a p-n junction diode, a switching diode, a thyristor, and/or the like.

Regardless, semiconductor based devices, such as the emitting device 10, are typically composed of layers. Each layer has a particular combination of molar fractions for the various elements (e.g., given values of x, y, and/or z). An interface between two layers is defined as a semiconductor heterojunction. At an interface, the combination of molar fractions is assumed to change by a discrete amount. A layer in which the combination of molar fractions changes continuously is said to be graded. A stack of semiconductor layers can include several n-type doped layers and one or more p-type doped layers. A typical semiconductor device requires ohmic contacts.

As shown in FIG. 2, the emitting device 10 includes a heterostructure comprising a substrate 12, a buffer layer 14 adjacent to the substrate 12, an n-type cladding layer 16 (e.g., an electron supply layer) adjacent to the buffer layer 14, and an active region 18 having an n-type side 19A adjacent to the n-type cladding layer 16. Furthermore, the heterostructure of the emitting device 10 includes a p-type layer 20 (e.g., an electron blocking layer) adjacent to a p-type side 19B of the active region 18 and a p-type cladding layer 22 (e.g., a hole supply layer) adjacent to the p-type layer 20.

In a more particular illustrative embodiment, the emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, both the n-type cladding layer 16 and the p-type layer 20 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, and 20. The substrate 12 can be sapphire, silicon (Si), germanium, silicon carbide (SiC), a bulk semiconductor template material, such as AlN, GaN, BN, AlGaN, AlInN, AlON, LiGaO$_2$, AlGaBN, AlGaInN, AlGaInBN, and/or the like, or another suitable material, and can be polar, non-polar, or semi-polar. The buffer layer 14 can be composed of AlN, AlGaN, AlInN, AlGaBN, AlGaInN, AlGaInBN, an AlGaN/AlN superlattice, and/or the like.

As shown with respect to the emitting device 10, a p-type metal 24 can be attached to the p-type cladding layer 22 and a p-type contact 26 can be attached to the p-type metal 24. Additionally, as described herein, an n-type contact layer 28 can be formed on the n-type cladding layer 16 and an n-type contact 30 can be formed on the n-type contact layer 28 using a process described herein. The p-type metal 24 and the n-type contact layer 28 can form ohmic contacts to the corresponding layers 22, 16, respectively. In an embodiment, the p-type metal 24 comprises several conductive and reflective metal layers, while the p-type contact 26 comprises a highly conductive metal. In an embodiment, the p-type cladding layer 22 and/or the p-type contact 26 can be transparent (e.g., semi-transparent or transparent) to the electromagnetic radiation generated by the active region 18. For example, the p-type cladding layer 22 and/or the p-type contact 26 can comprise a short period superlattice lattice structure, such as a transparent magnesium (Mg)-doped AlGaN/AlGaN short period superlattice structure (SPSL). Furthermore, the p-type contact 26 and/or the n-type contact layer 28 can be reflective of the electromagnetic radiation generated by the active region 18. In another embodiment, the n-type cladding layer 16 and/or the n-type contact layer 28 can be formed of a short period superlattice, such as an AlGaN SPSL, which is transparent to the electromagnetic radiation generated by the active region 18.

As used herein, a layer is transparent when the layer allows at least a portion of electromagnetic radiation in a corresponding range of radiation wavelengths to pass there through. For example, a transparent layer can be configured to allow at least portion of light in a range of radiation wavelengths corresponding to a peak emission wavelength for the light (such as ultraviolet light or deep ultraviolet light) emitted by the active region 18 (e.g., peak emission wavelength +/−five nanometers) to pass there through. As used herein, a layer is transparent to radiation if it allows more than approximately 0.5 percent of the radiation to pass there through. In a more particular embodiment, a transparent layer is configured to allow more than approximately five percent of the radiation to pass there through. In a still more particular embodiment, a transparent layer is configured to allow more than approximately ten percent of the radiation to pass there through. Similarly, a layer is reflective when the layer reflects at least a portion of the relevant electromagnetic radiation (e.g., light having wavelengths close to the peak emission of the active region). In an embodiment, a reflective layer is configured to reflect at least approximately five percent of the radiation.

As further shown with respect to the emitting device 10, the device 10 can be mounted to a submount 36 via the contacts 26, 30. In this case, the substrate 12 is located on the top of the emitting device 10. To this extent, the p-type contact 26 and the n-type contact 30 can both be attached to a submount 36 via contact pads 32, 34, respectively. In an embodiment, the n-type contact layer 28 is a transparent material, while the n-type contact 30 is a reflective material (e.g., a metal) to improve light extraction from the n-type contact layer 28. The submount 36 can be formed of aluminum nitride (AlN), silicon carbide (SiC), and/or the like.

It is understood that the layer configuration of the emitting device 10 described herein is only illustrative. To this extent, an emitting device/heterostructure can include an alternative layer configuration, one or more additional layers, and/or the like. As a result, while the various layers are shown immediately adjacent to one another (e.g., contacting one another), it is understood that one or more intermediate layers can be present in an emitting device/heterostructure.

Formation of the device 10 using a prior art solution typically includes etching the p-type cladding layer 22, p-type layer 20, and active region 18 to expose the n-type cladding layer 16 in a region where an n-type contact is to be formed. Subsequently, a metal (not shown) is typically deposited on the n-type cladding layer 16 and the n-type contact 30 is formed on the metal to form an ohmic n-type contact. A similar procedure is employed for forming ohmic contacts for transistors and other types of semiconductor devices. In contrast, the inventors propose a process for manufacturing a device, such as the emitting device 10, or a heterostructure for the device, which does not require etching of the n-type cladding layer 16 and/or any other layer, to form one or more contacts, such as the n-type contact 30. While described in conjunction with formation of the n-type contact 30, it is understood that aspects of the invention can be directed to the formation of a p-type contact, such as the p-type contact 26.

Figure 3:
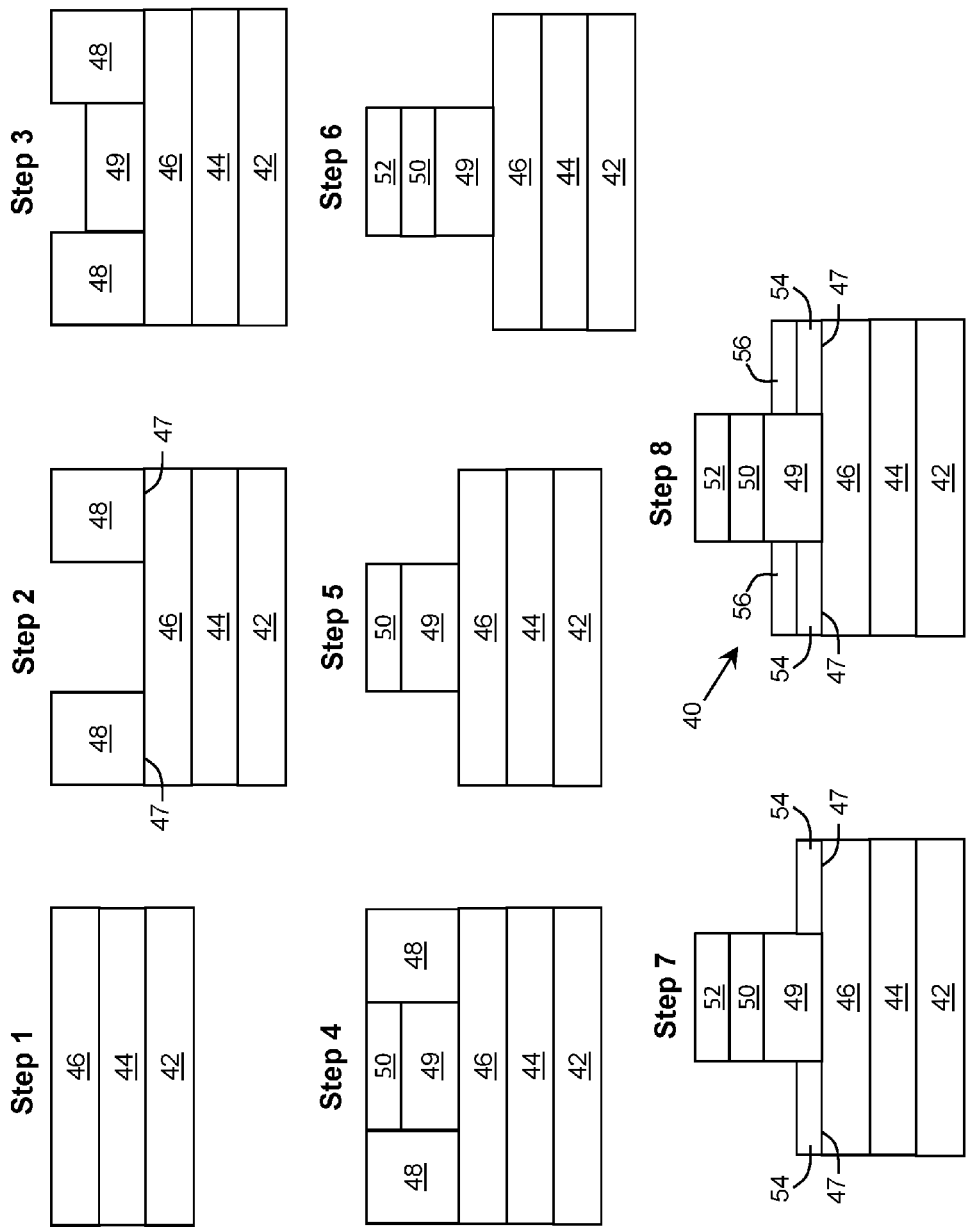
FIG. 3 shows an illustrative series of acts for fabricating a device heterostructure according to an embodiment.

To this extent, FIG. 3 shows an illustrative series of acts for fabricating a device heterostructure 40 (shown in step 8) including at least one contact 56 to a semiconductor layer 46 in the device heterostructure 40 according to an embodiment. As described herein, the process can be used to form one or more ohmic contacts to the semiconductor layer 46. The semiconductor layer 46 can be a p-type layer or an n-type layer. The process described herein enables such a contact to be produced without etching.

In step 1, a heterostructure is obtained (e.g., formed, grown, purchased, and/or the like), which includes a substrate 42, a first layer 44 on the substrate 42, and a second layer 46 on the first layer 44. In an embodiment, the layers 44, 46 are group III-nitride layers, which are grown epitaxially on a substrate 42 comprising any type of substrate material as described herein. In another embodiment, the layer 44 is a buffer or nucleation layer, which is grown on the substrate 42 prior to epitaxial growth of other layers, such as the layer 46. While three layers 42, 44, 46 are shown, it is understood that any number of layers can be included.

To this extent, a layer 44, 46 can include multiple semiconductor layers and/or multiple sublayers for a layer.

Regardless, each semiconductor layer can include varying composition grown under various growth conditions. For example, in an embodiment layers of the same composition can be grown at different temperatures, different III/V ratios, and/or the like. Furthermore, the layer 46 can include at least one layer formed of a doped material. The doping can be configured to provide conductive pathways between an ohmic contact to be subsequently formed on a set of contact regions of the layer 46. In an embodiment, the layer 46 is formed of a doped gallium nitride (GaN) semiconductor material having a low carrier ionization energy.

In step 2, a set of masks 48 are formed on a set of contact regions 47 on a surface of the layer 46. The masks 48 can be any type of masking material, which can be removed without damaging the underlying semiconductor layers 46. In an embodiment, the masks 48 comprise silicon dioxide ($SiO_2$) or silicon nitride ($Si_3N_4$). In a more particular embodiment, the set of masks 48 are formed by first applying the masking material over substantially an entire surface of the layer 46. Subsequently, the masking material can be removed from some regions of the surface of the layer 46 to form the set of masks 48 on the set of contact regions 47. Removal of the masking material can be performed, for example, using a photolithographic technique, or the like.

In step 3, a protruded mesa like semiconducting region 49 having a high carrier conductivity is formed over the layer 46. The protruded region 49 can have optical and/or electrical properties that are different from the layer 46. For example, the protruded region 49 can be formed of a material having a higher conductivity than the material of the layer 46. However, the protruded region 49 can be of the same type (e.g., n-type or p-type) as that of the layer 46. An overgrowth procedure using a doped semiconductor material (e.g., the doped GaN described herein) can be used to form the protruded region 49. In step 4, a semiconductor layer 50 can be grown above the protruded region 49. The semiconductor layer 50 can comprise, for example, several semiconductor sublayers with distinct composition and/or grown using different growth conditions. In one possible embodiment, the semiconductor layer 50 is formed of a material having a wider band gap than the band gap of the material forming the protruded region 49. When the semiconductor layer 50 is formed of a heavily doped material, a two dimensional electron gas may be formed at an interface between the semiconductor layer 50 and the protruded region 49.

In another possible embodiment, the semiconductor layer 50 is formed of a material having different optical and/or electrical characteristics than the material forming layer 46. For instance, the semiconductor layer 50 can be grown under different epitaxial growth conditions that include varying V/III ratio, temperature and other growth parameters. In yet another embodiment, the semiconductor layer 50 can comprise a multilayered structure, such as a superlattice of group III nitride sublayers or the like. In another embodiment, the semiconductor layer 50 can form a p-type region, with an interface between the semiconductor layer 50 and the protruded region 49 containing a light emitting region comprising of quantum wells and barriers.

Once a desired set of semiconducting layers have been formed for the device heterostructure 40, the device heterostructure can be prepared for the formation of a set of ohmic contacts. To this extent, in step 5, the masking material forming the mask(s) 48 is removed for subsequent semiconductor overgrowth. In step 6, a mask 52 can be placed on the semiconductor layer 50 (or the protruded region 49 if the semiconductor layer 50 is not present) using any solution (e.g., by applying a masking material such as $SiO_2$, $Si_3N_4$, or the like). The mask 52 can be applied, for example, to deposit a gate contact above the insulating surface when the heterostructure 40 is to be used for a transistor device. To this extent, it is understood that a mask 52 may not be applied for some types of semiconductor devices.

Subsequently, a set of ohmic contacts can be formed on the set of contact regions 47 of the semiconducting layer 46. In an embodiment, the set of ohmic contacts are formed at a processing temperature that is lower than a temperature range within which a quality of the material forming any of the semiconductor layers 42, 44, 46, 50 in the device heterostructure 40 is damaged. For example, referring briefly to the device 10 of FIG. 2 as an illustrative example, the formation of the n-type contact 30 can be performed at a temperature that will not damage the quality of the materials forming the p-type cladding layer 22, p-type layer 20, active region 18, or the n-type cladding layer 16. In an embodiment, for a device heterostructure formed using group III-nitride materials, a preferred temperature range for p-type layer growth is between 950 and 1050 degrees Celsius. In this case, a processing temperature used in the formation of the set of ohmic contacts can be lower than 950 degrees Celsius, e.g., in a range between approximately 850 and approximately 950 degrees Celsius.

In step 7, a set of highly conductive semiconducting layers 54 can be overgrown on the set of contact regions 47 of the heterostructure 40 using any solution. Depending on the corresponding device for which the heterostructure 40 will be used, the epitaxial growth can be performed to a target thickness, which may or may not be larger than a thickness of the protruded region 49. For example, for a light emitting device, the overgrown semiconducting layers 54 can be the same type as the nearby semiconductor layers. In this case, a thickness of the semiconducting layers 54 can be less than or equal to a thickness of the protruded region 49.

Figure 1A:
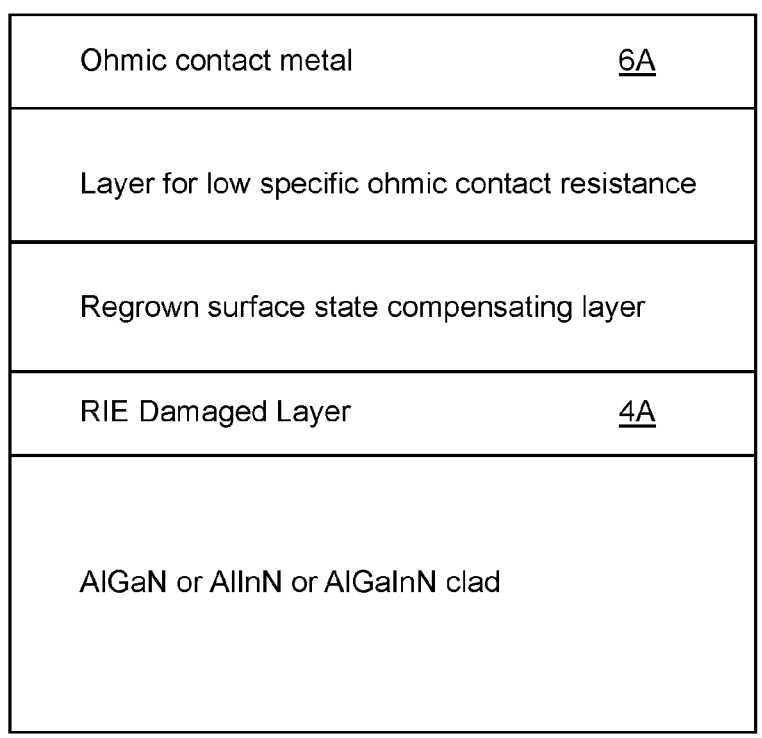
FIGS. 1A-1C show typical ohmic contacts formed using reactive ion etching (RIE) and re-growth processes according to the prior art.
Figure 1B:
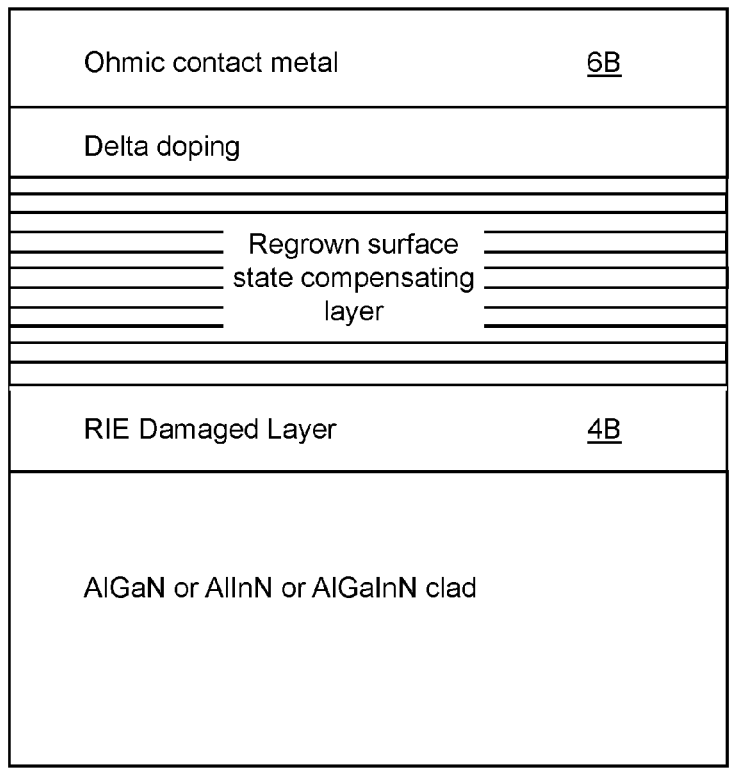
Figure 1C:
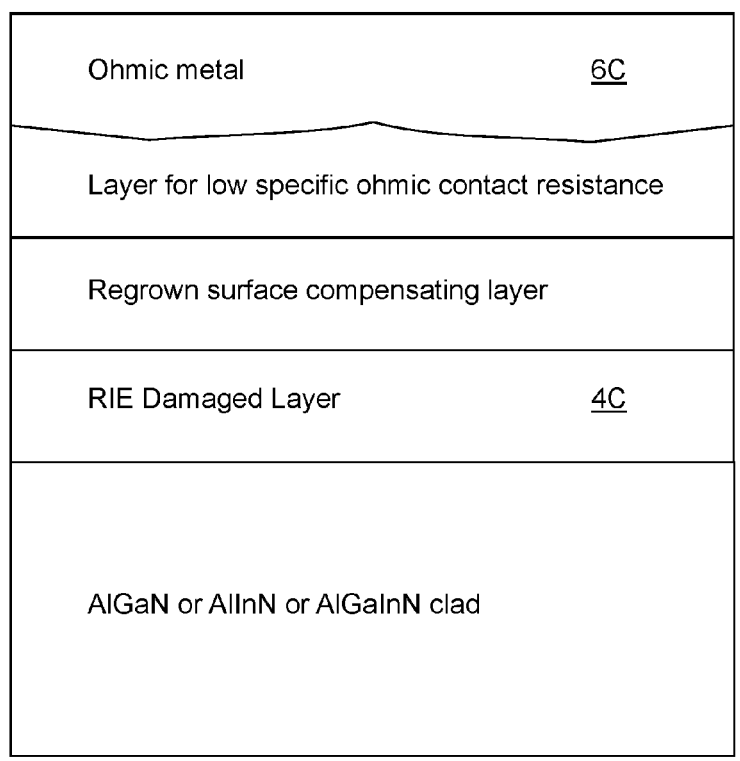

In step 8, an ohmic metal 56 can be deposited onto the set of semiconducting layers 54 to form a low resistance ohmic contact to the semiconducting layer 46. The ohmic metal 56 can be deposited using any solution, such as thermal evaporation, e-beam evaporation, chemical deposition, electroplating, galvanic deposition, and/or the like. In addition, the ohmic metal 56 can be annealed to form an interlayer between the ohmic metal 56 and the underlying set of semiconducting layers 54. The interlayer can comprise nano-size protrusions of the ohmic metal 56 into the set of semiconducting layers 54. An embodiment of the ohmic contact can include a rough surface, such as that shown in FIG. 1C, which can be prepared, for example, by selecting an appropriate set of growth conditions for the set of semiconducting layers 54. The set of growth conditions can include: growth at a high V/III ratio, growth at a lower temperature (e.g., temperatures at or below 1000 Celsius), and/or the like.

In an embodiment, the set of semiconducting layers 54 are formed of $Al_wIn_xGa_yB_zN$, where $0 \leq w, x, y, z \leq 1$, and $w+x+y+z=1$. In a more particular embodiment, the Al composition is less than one hundred percent, but more than one percent, i.e., $0.01 < w < 1$. In this case, illustrative group III materials include AlGaN, AlInGaN, AlInN, AlBN, AlInBN, AlGaBN, AlGaInBN, and/or the like. Additionally, the material can include an indium molar fraction, x, exceeding 0.001. When the set of semiconducting layers 54 includes multiple layers, the layers can have different molar fractions of the group III elements (i.e., different values for w, x, y, z), be grown using different growth conditions (e.g., temperature, mass flow ratio, such as V/III ratio, and/or the like), and/or the like. In an embodiment, the set of semiconducting layers 54 are formed of a material having a wider band gap than the semiconducting layer 46, thereby inducing a two dimensional free carrier gas at the interface between the semiconducting layer 46 (e.g., a clad layer of a light emitting device) and the set of semiconducting layers 54.

A composition of the set of semiconducting layers 54 can be substantially constant or can be graded. In an embodiment, the aluminum molar fraction, x, is varied as a function of distance from the ohmic metal 56. For example, the aluminum molar fraction can decrease from an interface of the set of semiconducting layers 54 and the ohmic metal 56 to an interface of the set of semiconducting layers 54 and the semiconductor layer 46. In another embodiment, the aluminum molar fraction is varied in tandem with varying indium concentration. For example, the indium molar fraction can increase while the aluminum molar fraction decreases as described above. The grading can be substantial and can, for example, include changes of aluminum molar ratio between 0 to 0.6 values. Alternatively, the indium molar fraction can decrease from the interface of the set of semiconducting layers 54 and the ohmic metal 56 to the interface of the set of semiconducting layers 54 and the semiconductor layer 46, while the aluminum molar fraction is kept substantially constant, thereby causing the indium to be replaced by gallium or another group III material.

The grading can be configured based on a target conduction band energy of the set of semiconducting layers 54, e.g., which can avoid inducing an accumulation of opposite carriers at the contact region 47 (e.g., holes for an n-type contact and electrons for a p-type contact) and/or to enable vertical current transport between the set of semiconducting layers 54 (e.g. highly doped) and the bottom semiconductor layer 46 (e.g., nearly undoped). For example, when the semiconductor layer 46 comprises a group III nitride material having a molar fraction of aluminum higher than forty percent (e.g., as part of an LED operating at very short ultraviolet wavelengths), the grading can be configured such that an overall energy change in the conduction band energy between any point of the set of semiconducting layers 54 and the conduction band energy of a surface point of the contact region 47 of the semiconductor layer 46 is less than approximately 3 kT, where k is the Boltzmann constant and T is an operational temperature of the device. The surface point can be any point of the semiconductor layer 46 within ten nanometers of the surface of the semiconductor layer 46 corresponding to the contact region 47.

One or more of the set of semiconducting layers 54 can comprise a superlattice. In this case, the superlattice can have a periodic or aperiodic variation of composition from period to period. Additionally, the growth of the semiconducting layers 54 can include delta doping the materials. In an embodiment, the semiconducting layers 54 include an n-type dopant. In a more particular illustrative embodiment, the set of semiconducting layers 54 can comprise a heavily doped n+ GaN layer.

One or more aspects of the set of semiconducting layers 54 and/or the ohmic metal 56 can be configured to improve a contact between the set of semiconducting layers 54 and the ohmic metal 56 and/or alter one or more aspects of the ohmic contact. For example, the set of semiconducting layers 54 can comprise a textured or patterned material, such as a group III nitride material. In an embodiment, a surface of the set of semiconducting layers 54 can include a series of pyramidal openings, with the ohmic metal 56 forming a series of opposing pyramids protruding into the set of semiconducting layers 56. In this case, adhesion between the ohmic metal 56 and the set of semiconducting layers 56 can be improved. It is understood that pyramid openings are only an illustrative example. In general, any type of protrusions from the ohmic metal 56 into the set of semiconducting layers 54 can improve contact properties such as contact resistance and adhesion. The formation of these inhomogeneous regions can be achieved, for example, by selecting appropriate growth conditions to produce a set of semiconductor layers 54 having a rough morphology. For example, such a condition can be due to so called three dimensional growth, which can be achieved at high values of V/III ratios and lower temperatures, such as temperatures around or under 1000 C. Alternatively, the set of semiconducting layers 54 can be etched or patterned prior to deposition of the ohmic metal 56. Finally, the inhomogeneous regions can arise during annealing of the ohmic metal 56.

Similarly, the ohmic metal 56 can include a plurality of needles contacting a surface of the set of semiconducting layers 54. For example, the needles can comprise periodic needles, which can be formed, for example, using lithographic processing. The ohmic metal 56 can include an overlaying layer of metal, which connects the needles. The needles can function as a grating for light extraction and/or reflection.

In an embodiment, the ohmic metal 56 can be alloyed such that the ohmic metal 56 penetrates the set of semiconducting layers 54 and contacts the underlying semiconductor layer 46. Furthermore, the ohmic metal 56 can be used for flip chip bonding to a heat sink (e.g., as shown in conjunction with the layer 34 of FIG. 2).

Figure 4:
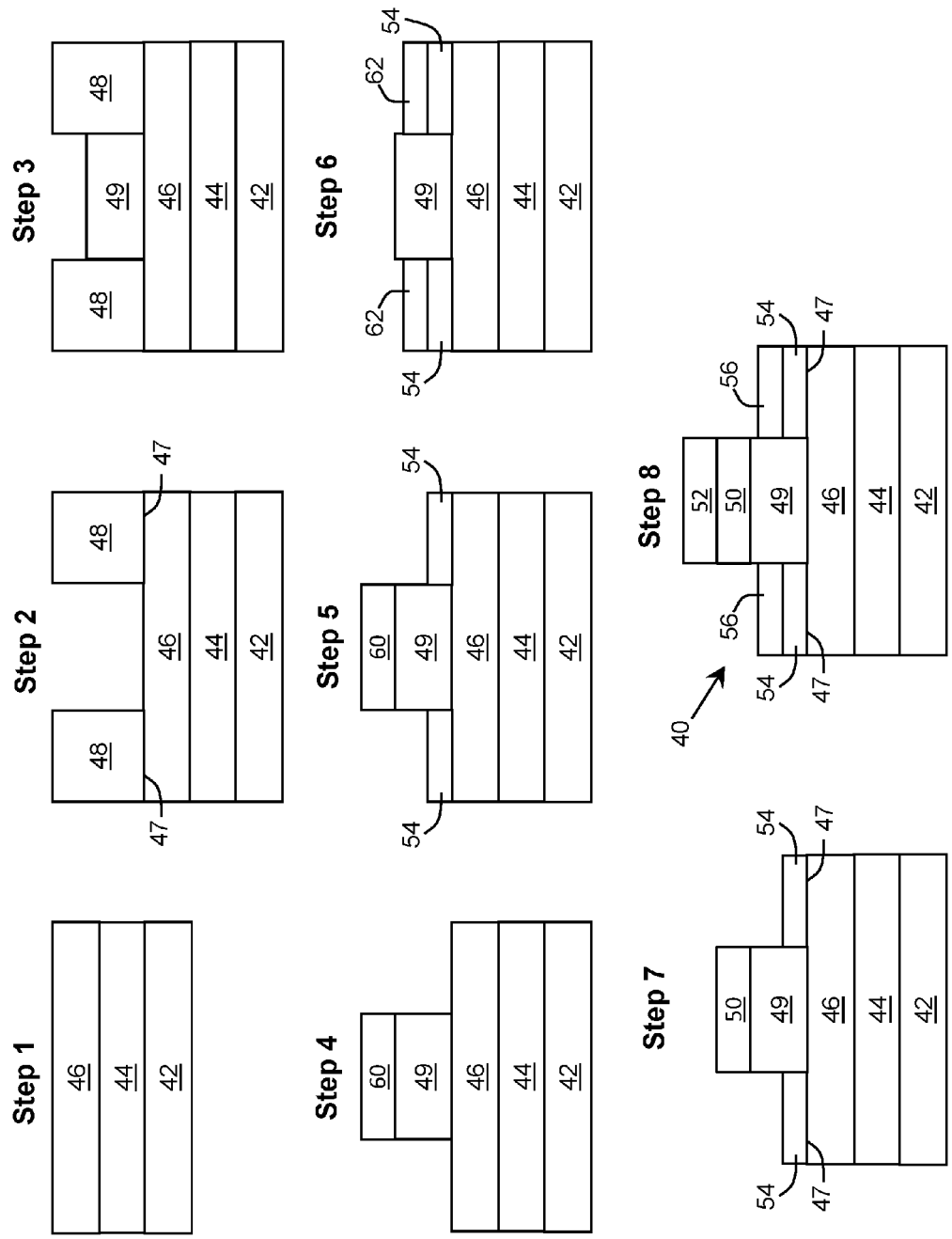
FIG. 4 shows another illustrative series of acts for fabricating a device heterostructure according to an embodiment.

It is understood that the steps 1-8 shown in FIG. 3 can be altered or steps can be added or removed. For example, FIG. 4 shows another illustrative series of acts for fabricating a device heterostructure according to an embodiment. In this case, the steps 1-3 are the same as in FIG. 3 but subsequent steps are altered. In particular, in step 4, a masking region 60 is formed on the protruded region 49, and the set of masks 48 are removed. In step 5, regrowth of the set of semiconducting layers 54 is performed. In step 6, the masking region 60 is removed and a set of masking regions 62 are formed on the set of semiconducting layers 54. In step 7, the semiconductor layer 50 is formed and the set of masking regions 62 are removed. In step 8, the masking layer 52 is formed on the semiconductor layer 50 and the ohmic metal 56 is deposited on the set of semiconducting layers 54. In this process, the semiconductor layer 50 is formed after the set of semiconducting layers 54, which can allow for further control of the temperature at which epitaxial growth of the set of semiconducting layers 54 takes place. For example, the embodiment of FIG. 4 can be utilized when the temperature for the epitaxial growth of the semiconductor layer 50 is lower than the temperature for the epitaxial growth of the set of semiconducting layers 54.

While shown and described in conjunction with a process for forming a set of ohmic contacts using an overgrowth procedure, which does not require etching, it is understood that aspects of the invention provide additional embodiments. For example, embodiments provide an overgrown contact formed using a procedure described herein. In this case, the contact can include a pseudomorphic match, in which the set of semiconducting layers 54 are lattice matched with the semiconductor layer 46 at an interface between the semiconductor layer 46 and the set of semiconducting layers 54. Furthermore, embodiments provide a process for fabricating a device including one or more ohmic contacts formed using a process described herein.

Figure 5:
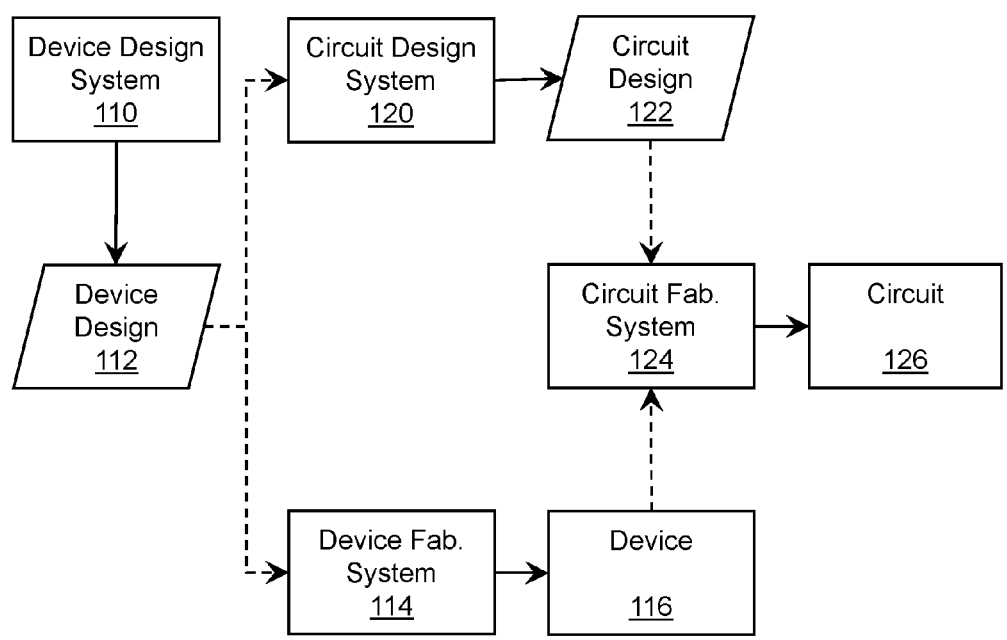
FIG. 5 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 5 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device heterostructure comprising:
   a semiconductor layer;
   a protruded region located directly on a first region of a surface of the semiconductor layer; and
   an ohmic contact located on a set of contact regions of the surface of the semiconductor layer distinct from the first region of the surface of the semiconductor layer, wherein the ohmic contact is formed without etching the semiconductor layer, and wherein the forming includes:
      forming a set of highly conductive semiconducting layers on the set of contact regions, wherein the forming the set of highly conductive semiconducting layers includes grading a molar fraction of at least one element of a material forming the set of highly conductive semiconducting layers with respect to a distance from the set of contact regions; and
      forming an ohmic metal on the set of highly conductive semiconducting layers after formation of the protruded region, wherein the forming the ohmic contact is performed at a processing temperature lower than a temperature range within which a quality of a material forming any one of the set of semiconductor layers in the device heterostructure is damaged.

2. The heterostructure of claim 1, further comprising an active region located on the protruded region.

3. The heterostructure of claim 2, the heterostructure further comprising a second contact located on the active region, wherein the ohmic contact is one of: an n-type contact or a p-type contact, and wherein the second contact is the other of: the n-type contact or the p-type contact.

4. The heterostructure of claim 2, wherein the active region is a light emitting active region.

5. The method of claim 1, wherein the semiconducting layers of the heterostructure are formed of group III nitride materials.

6. The method of claim 1, wherein the set of highly conductive semiconducting layers are lattice matched with the semiconductor layer at an interface of the semiconductor layer and the set of highly conductive semiconducting layers.

7. The method of claim 1, wherein the set of highly conductive semiconducting layers are delta doped.

8. The method of claim 1, wherein the set of highly conductive semiconducting layers are formed of group III nitride materials, and wherein the grading results in a decreasing aluminum molar fraction in a direction away from the set of contact regions.

9. The method of claim 1, wherein the grading is configured to avoid inducing an accumulation of opposite carriers at the set of contact regions.

10. The method of claim 1, wherein the set of semiconductor layers of the device heterostructure are formed of group III nitride materials.

11. A device comprising:
a device heterostructure including:
an ohmic contact to a semiconductor layer in a set of semiconductor layers of the device heterostructure, wherein the ohmic contact includes:
a set of highly conductive semiconducting layers formed on a set of contact regions of a surface of the semiconductor layer, wherein the set of highly conductive semiconducting layers include a molar fraction of at least one element of a material forming the set of highly conductive semiconducting layers graded with respect to a distance from the set of contact regions, and wherein the set of highly conductive semiconducting layers are lattice matched with the semiconductor layer at an interface of the semiconductor layer and the set of highly conductive semiconducting layers; and
an ohmic metal located on a surface of the set of highly conductive semiconducting layers; and
a protruding region formed on at least one region of the surface of the semiconductor layer distinct from the set of contact regions.

12. The device of claim 11, wherein the ohmic contact is formed without etching the semiconductor layer, wherein the forming includes forming the ohmic contact on the set of contact regions after formation of the protruded region, wherein the forming the ohmic contact is performed at a processing temperature lower than a temperature range within which a quality of a material forming any one of the set of semiconductor layers in the device heterostructure is damaged.

13. The device of claim 11, wherein the semiconducting layers of the heterostructure are formed of group III nitride materials.

14. The device of claim 11, wherein the set of highly conductive semiconducting layers are delta doped.

15. The device of claim 11, wherein the set of highly conductive semiconducting layers are formed of group III nitride materials, and wherein the grading results in a decreasing aluminum molar fraction in a direction away from the set of contact regions.

16. The device of claim 11, wherein the grading is configured to avoid inducing an accumulation of opposite carriers at the set of contact regions.

17. A device comprising:
a device heterostructure including:
an n-type group III nitride semiconductor layer;
an ohmic contact to the n-type group III nitride semiconductor layer, wherein the ohmic contact is located on a first surface of the semiconductor layer, wherein the ohmic contact includes:
a set of highly conductive group III nitride semiconducting layers, wherein the set of highly conductive semiconducting layers include a molar fraction of at least one element of a material forming the set of highly conductive semiconducting layers graded with respect to a distance from the set of contact regions, and wherein the set of highly conductive group III nitride semiconducting layers are lattice matched with the n-type group III nitride semiconductor layer at an interface of the n-type group III nitride semiconductor layer and the set of highly conductive group III nitride semiconducting layers; and
an ohmic metal located on a surface of the set of highly conductive group III nitride semiconducting layers; and
a protruded region located on the first surface of the n-type group III nitride semiconductor layer adjacent to the ohmic contact.

18. The device of claim 17, the device heterostructure further comprising:
an active region located on the protruded region; and
a p-type contact located on the active region.

19. The device of claim 18, wherein the active region is a light emitting active region.

20. The device of claim 17, wherein the device is a transistor.

* * * * *